(12) United States Patent
Inoue et al.

(10) Patent No.: US 7,864,081 B2
(45) Date of Patent: *Jan. 4, 2011

(54) FAST IMPLEMENTATION OF DECODING FUNCTION FOR VARIABLE LENGTH ENCODING

(75) Inventors: Hiroshi Inoue, Kanagawa-ken (JP); Hideaki Komatsu, Kanagawa-ken (JP); Moriyoshi Ohara, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 246 days.

This patent is subject to a terminal disclaimer.

(21) Appl. No.: 12/135,257

(22) Filed: Jun. 9, 2008

(65) Prior Publication Data

US 2008/0238735 A1    Oct. 2, 2008

Related U.S. Application Data

(63) Continuation of application No. 11/621,285, filed on Jan. 9, 2007, now Pat. No. 7,394,411.

(51) Int. Cl.
*H03M 7/00* (2006.01)
(52) U.S. Cl. .................................................. 341/67
(58) Field of Classification Search .................. 341/65, 341/67
See application file for complete search history.

(56) References Cited

U.S. PATENT DOCUMENTS

| 5,530,884 | A | 6/1996 | Sprague et al. |
| 5,929,793 | A | 7/1999 | Choi |
| 6,304,197 | B1 | 10/2001 | Freking et al. |
| 6,573,846 | B1 * | 6/2003 | Trivedi et al. ............... 341/67 |
| 6,580,828 | B1 | 6/2003 | Li |
| 6,693,643 | B1 | 2/2004 | Trivedi et al. |
| 6,707,398 | B1 | 3/2004 | Lin et al. |
| 6,775,414 | B1 | 8/2004 | Fogg et al. |
| 7,283,591 | B2 | 10/2007 | Ruehle |
| RE39,925 | E | 11/2007 | Mitchell et al. |
| 2005/0231397 | A1 | 10/2005 | Koseki et al. |

OTHER PUBLICATIONS

PowerPC Microprocessor Family: Vector/SIMD Multimedia Extension Technology Programming Environments Manual, Sep. 30, 2005, IBM Systems and Technology Group, Hopewell Junction, NY.
Information technology—ASN.1 encoding rules: Specification of Basic Encoding Rules (BER), Canonical Encoding Rules (CER) and Distinguished Encoding Rules (DER), Geneva, Switzerland.

* cited by examiner

*Primary Examiner*—Howard Williams
(74) *Attorney, Agent, or Firm*—Cantor Colburn LLP; Vazken Alexanian

(57) ABSTRACT

An embodiment of the present inventions is a method for encoding/decoding data of variable length format and is used to omit unnecessary pieces of data for the purpose of improving processing performance, reducing the size of data on communication paths and efficiently using limited physical memory. As examples of such variable length encoding, BER compression and UTF-8 encoding of UNICODE text, etc., are cited. While the amount of data can be reduced through encoding, before the data is actually used, it is necessary to restore (decode) it to the original data, which requires a great deal of processing time. One aspect of the present invention is improving decoding by reducing the processing time required to decode the encoded data.

8 Claims, 6 Drawing Sheets

```
BYTE *pin = encoded_data;
INT32 *pout = decoded_data;
while (pin < end) {
  prefix = pin[0] >> 6;
  switch (prefix) {
    case 0:
      *pout = pin[0];
      break;
    case 1:
      *pout = (pin[0] & 0x3F) << 8 | pin[1];
      break;
    case 2:
      *pout = (pin[0] & 0x3F) << 16 | pin[1] << 8 | pin[2];
      break;
    case 3:
      *pout = (pin[0] & 0x3F) << 24 | pin[1] << 16 |
              pin[2] << 8 | pin[3];
      break;
  }
  pin += prefix + 1; // length of encoded data = (prefix + 1) bytes
  pout++;
}
```

1000

```
BYTE *pin = encoded_data;
INT32 *pout = decoded_data;
while (pin < end) {
  gathered_prefix = 0;
  position = 0;

// Step 1
  // gathering prefixes from four elements
  for (i=0; i<4; i++) {
    prefix = (pin[position] >> 6);
    gathered_prefix = (gathered_prefix << 2) | prefix;
    position += prefix+1;
  }

// Step 2
  // looking up constant tables by using gathered prefix
  vector char vpattern = pattern_table[gathered_prefix];
  vector char vmask = mask_table[gathered_prefix];

// load one vector from memory
  vector char vin = vector_load(pin);

// Step 3
  // rearranging data by permutation
  vtmp = vector_permute(vin, vpattern);

// masking off prefix bits
  vout = vector_and(vtmp, vmask);

// store the decoded data
  vector_store(vout, pout);

// advancing pointers
  pin += position;
  pout += 4;
}
```

Fig. 4

FAST IMPLEMENTATION OF DECODING FUNCTION FOR VARIABLE LENGTH ENCODING

CROSS-REFERENCE TO RELATED APPLICATIONS

This application is a continuation of U.S. patent application Ser. No. 11/621,285 filed Jan. 9, 2007, the contents of which are incorporated by reference herein in their entirety.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to a method for encoding/decoding data of a variable length format and in particular to using the method to omit unnecessary pieces of data for the purpose of improved processing performance, reducing the size of data on communication paths, and efficiently using limited physical memory.

2. Description of Background

Before our invention encoding data is commonly utilized as a way in which to compress and reduce the physical size of the data while maintaining the data integrity. As such, a variety of encoding and decoding algorithms are available and many have been optimized for particular types and or kinds of data.

A problem with current encoding schemes is that data is encoded with no consideration given to efficiently encoding the data such that decode processing time is minimized. In this regard, existing decoding/encoding programs are inefficient and require lots of processing time to decode the data.

As such, current encoding and decoding routines are inefficient, and typically process unnecessary data. All of which consumes valuable processing time, and increases the size of data on communication paths. As such, eliminating unnecessary data by way of an improved encoding and decoding method resulting in a method of speeding up decoding processing time significantly improves processing performance and in part gives rise to the present invention.

SUMMARY OF THE INVENTION

The shortcomings of the prior art are overcome and additional advantages are provided through the provision of a method of simultaneous processing data elements in decoding operation of variable length encoded data, said method comprising: collecting a plurality of data to be decoded; determining an encoded data length for each of the plurality of data; obtaining a plurality of parameters based on the determination of the encoded data length of each of the plurality of data; and performing operations on each of the plurality of data.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution, which is a method of speeding up the decoding of encoded data.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

FIG. 4 illustrates one example of a program for restoration processing by way of routine 1000;

The detailed description explains the preferred embodiments of the invention, together with advantages and features, by way of example with reference to the drawings.

DETAILED DESCRIPTION OF THE INVENTION

Turning now to the drawings in greater detail, in an exemplary embodiment of the present invention a method of variable length encoding/decoding of a plurality of data simultaneously is utilized to reduce the number of conditional branching instructions and arithmetic instructions, which cause a lowering of execution efficiency, and as such a realization of higher speed processing, mainly through a permute instruction.

To explain the decoding of variable length encoding, an example of simplified encoding rule is shown in Table 1 below. In the encoding, integer type data of up to 30 bits in length is expressed by a data format of 1 to 4 bytes, with a 2-bit prefix being added.

TABLE 1

| Input data length | Encoded data length | 2-bit prefix | Format [first byte] [second byte] . . . X: data bit |
|---|---|---|---|
| 1 to 6 bits | 1 byte | 0 (00b) | [00xxxxxx] |
| 7 to 14 bits | 2 bytes | 1 (01b) | [01xxxxxx] [xxxxxxxx] |
| 15 to 22 bits | 3 bytes | 2 (10b) | [10xxxxxx] [xxxxxxxx] [xxxxxxxx] |

TABLE 1-continued

| Input data length | Encoded data length | 2-bit prefix | Format [first byte] [second byte] . . . X: data bit |
|---|---|---|---|
| 23 to 30 bits | 4 bytes | 3 (11b) | [11xxxxxx] [xxxxxxxx] [xxxxxxxx] [xxxxxxxx] |

In the encoding, if the ratio of data having a short input data length is higher, the amount of data will be reduced. One example of a program for performing restoration of the encoded data according to this rule is illustrated in FIG. 1.

Figures 1, 2:
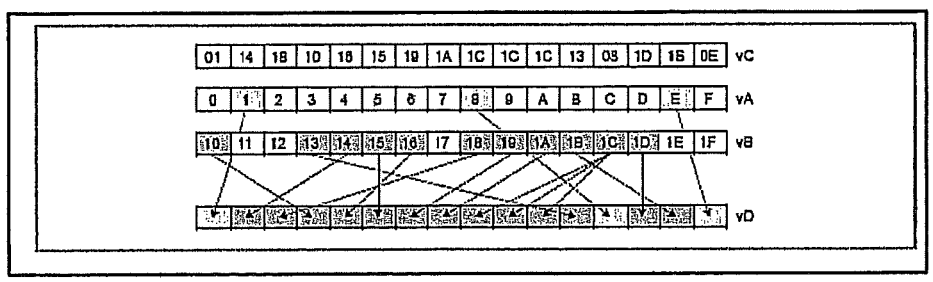
FIG. 1 illustrates one example of a program restoration processing.
FIG. 2 illustrates one example of permute instruction of VMX.

As illustrated in FIG. 1, since the restoration operation of the variable length data generally includes a number of conditional branches and the decoding of each element concurrently depends on the decoding of the previous element, there is the problem that the parallelism of the instruction level is lowered.

As a premise of the present invention, an explanation will be given regarding the permute instruction (as example see IBM Corp. PowerPC Microprocessor Family: Vector/SIMD Multimedia Extension Technology Programming Environments Manual). A permute (or shuffle) instruction is an instruction for rearranging the content of the input register in an arbitrary order. To give an example of the permute instruction of the VMX, which is an SIMD instruction set of the PowerPC, three 16-byte vector registers are treated as input, one vector register as output, and the data of the vector register as sixteen 1-byte rows, respectively. In this instruction, the first and second arguments are first of all combined in this order to make thirty-two 1-byte rows. Based on this, the byte value at the position indicated by the location of the value of the lower 5 bits of each element of the third argument is returned as a return value of the position corresponding to the element. Thus, it becomes possible to rearrange the input data in units of bytes in an arbitrary order. An example of the operation of the permute instruction of the VMX one example of which is illustrate in FIG. 2.

Explanations will be given regarding the method of the present invention, using the format shown above in the table as an example. That is to say, an arrangement expressed by variable length encoding of 1 to 4 bytes is decoded in order to be output as an arrangement of a 32-bit integer. According to the method of the present invention, a plurality of data is processed simultaneously. However, explanations will be given on the basis of 4 pieces of data being processed simultaneously. This corresponds to a case where, by using a register of 16-byte length, a 32-bit integer is processed. However, the present method is not limited to this parallelism; 8 pieces of data (8 characters) will be decoded simultaneously in the decoding of the UTF-8 to be described later. Furthermore, the present invention is mainly intended for the decoding of encoded data, however, the object is not limited to this use. For example, it is possible apply it in encoding, using the rules illustrated in the table above.

Figure 3:
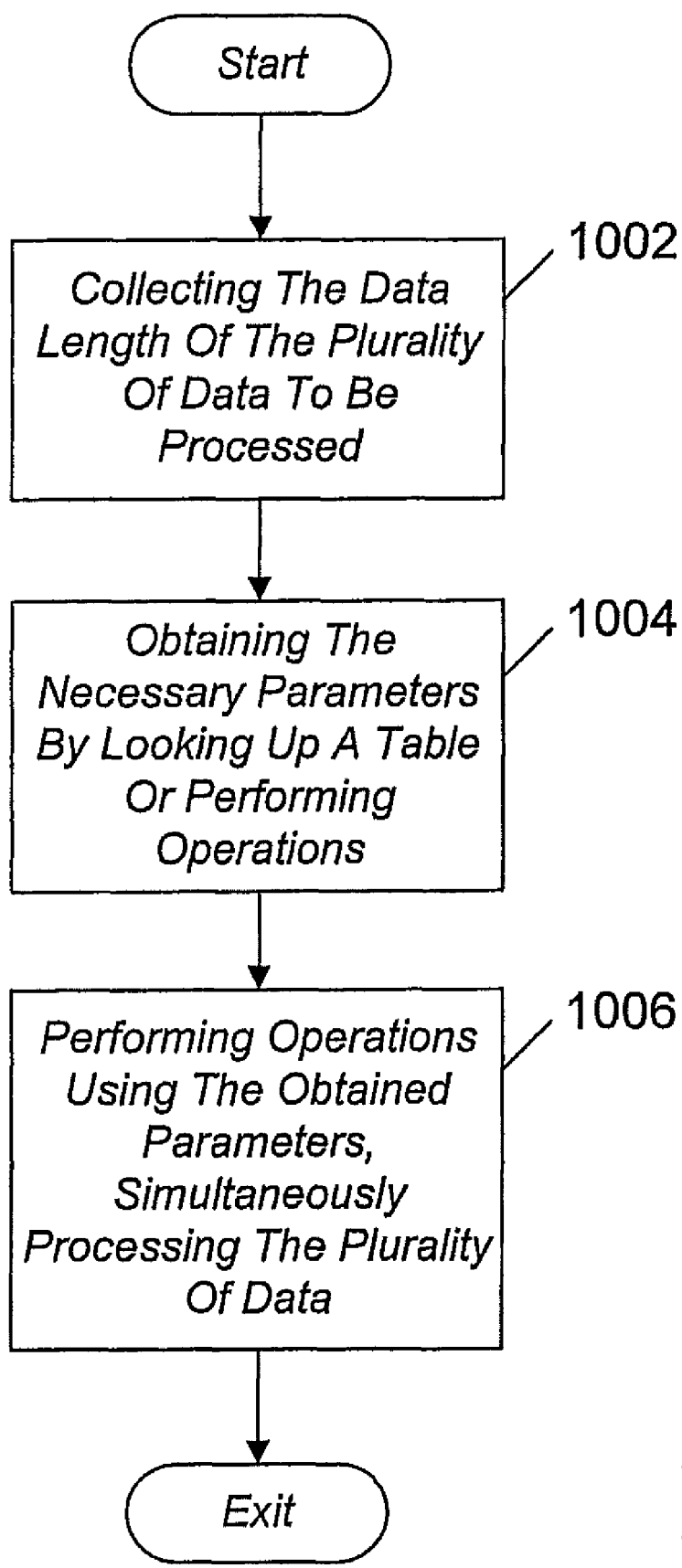
FIG. 3 illustrates one example of a method of simultaneous processing of a plurality of elements in decoding operations of variable length encoding data routine 1000.

Referring to FIG. 3 there is illustrated one example of a method of simultaneous processing of a plurality of elements in decoding operations of variable length encoding data routine 1000. In an exemplary embodiment, the present method collects the data length of the plurality of data to be processed, obtains the necessary parameters by looking up a table or performing operations, and performs operations using the obtained parameters, simultaneously processing the plurality of data. The method begins in block 1002.

In block 1002 the data length of the plurality of data to be processed is collected. Processing then moves to block 1004.

In block 1004 the parameters by looking up a table or performing operations is obtained. In this regard, FIGS. 6 and 7 further illustrate the process of obtaining in block 1004 and performing in block 1006. Processing then moves to block 1006.

In block 1006 operations using the obtained parameters are performed simultaneously processing the plurality of data. The routine in then exited.

Referring to FIG. 4 there is illustrated one example of such processing. In the example in FIG. 4, the prefixes of 4 pieces of input data are collected (functionality of block 1004). Two parameters are loaded, which are vpattern for rearranging data through the permute instruction and vmask for masking prefix bits (functionality of block 1004). After the encoded data is loaded, processing is actually performed by using two parameters (functionality of block 1006).

Here, if the prefix of the 4 pieces of input data is, for example, in an order of [0, 1, 2, 1], a constant number table is prepared, in order for the values of the two parameters to become as follows.

vpattern={*, *, *, 0x00, *, *, 0x01, 0x02, *, 0x03, 0x04, 0x05, *, *, 0x06, 0x07} vmask={0, 0, 0, 0x3F, 0, 0, 0x3F, 0xFF, 0, 0x3F, 0xFF, 0xFF, 0, 0, 0x3F, 0xFF}

Figure 5:
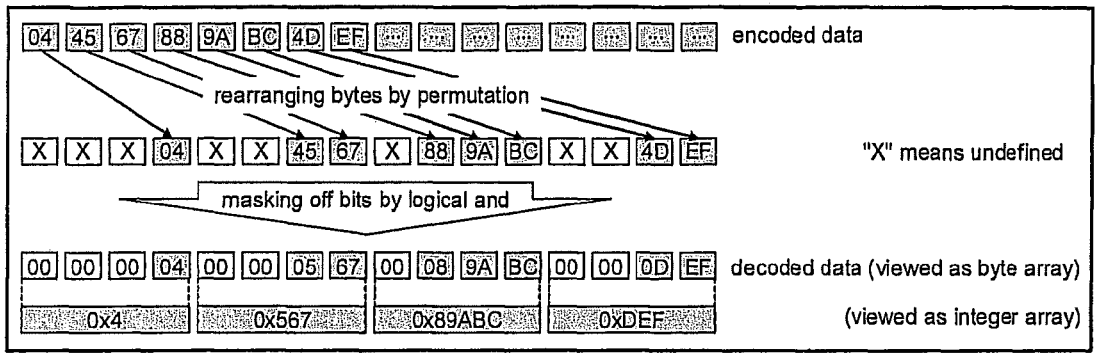
FIG. 5 illustrates one example of a decoding operation.

Additionally, '*' denotes an arbitrary value. One example of processing in this case is illustrated in FIG. 5. Advantages of this program are, as compared with the code of FIG. 1 that four pieces of data can be processed at one time and, since conditional branching is not used, there are no penalties from branching mis-predictions. Furthermore, the processing of block 1002 does not depend on that of block 1004 and block 1006 in the previous iteration; therefore, it can be executed in parallel, having the parallelism of a high instruction level, as compared to the code in FIG. 1. In addition, in FIG. 4, for the purpose of explanation, block 1002 functionality is described through scalar instructions; however, this part can be processed through SIMD instructions as well.

Conversely, the problem is that a table lookup in block 1004 functionality or operation costs become necessary. In an exemplary embodiment, referred to as embodiment 1 in FIG. 6, using the program in FIG. 4 can perform decoding of the simple encoding of the Table 1 shown above.

Figure 6:
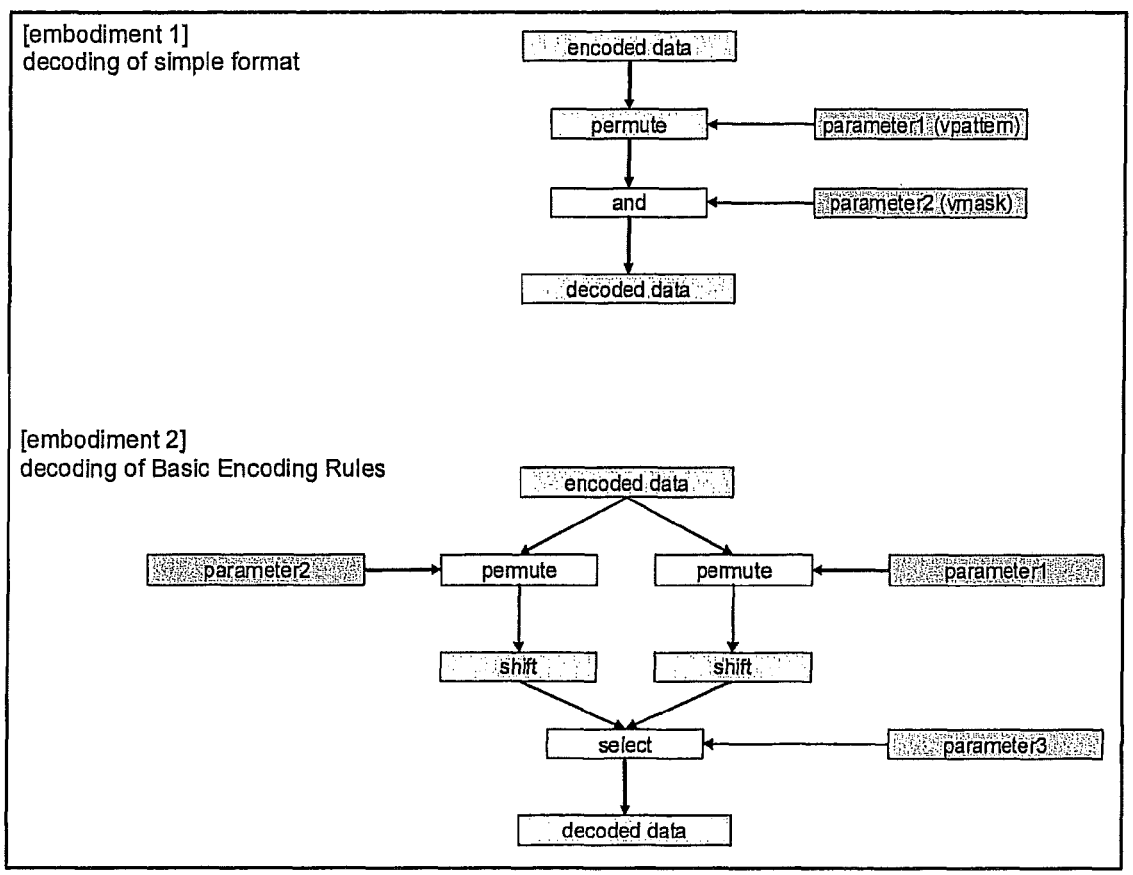
FIG. 6 illustrates one example of obtaining parameters and performing operations of routine 1000 specific to BER compression decoding.

In another exemplary embodiment, referred to as embodiment 2 in FIG. 6, decoding of BER (Basic Encoding Rules) compression can be effectuated. In this regard, a variable length encoding format that is included in ITU-T recommendation X.690 (ITU-T Recommendation X.690, Information technology—ASN.1 encoding rules: Specification of Basic Encoding Rules (BER), Canonical Encoding Rules (CER) and Distinguished Encoding Rules (DER)), and it is widely employed not only in the communication field but also in various fields of application. BER compression is variable length encoding, which shows that in 1 byte of data, the first bit is a flag and the remaining 7 bits are data, and when the flag bit is 1, the byte continues to the following byte. While this encoding rule is more complicated it is possible to perform processing in nearly the same fashion as decoding in embodiment 1.

Referring to FIG. 6 there is illustrated logic for making some decisions and applying rules. An example is illustrated in FIG. 6, which can be implemented by the VMX. In FIG. 6, the Select is the select instruction of the VMX, using the value of the register as a mask, which is the third argument, and it is the instruction to output the corresponding bit of the first argument when the mask bit is '0' and to output the corresponding bit of the second argument when the mask bit is '1'.

Figure 7:
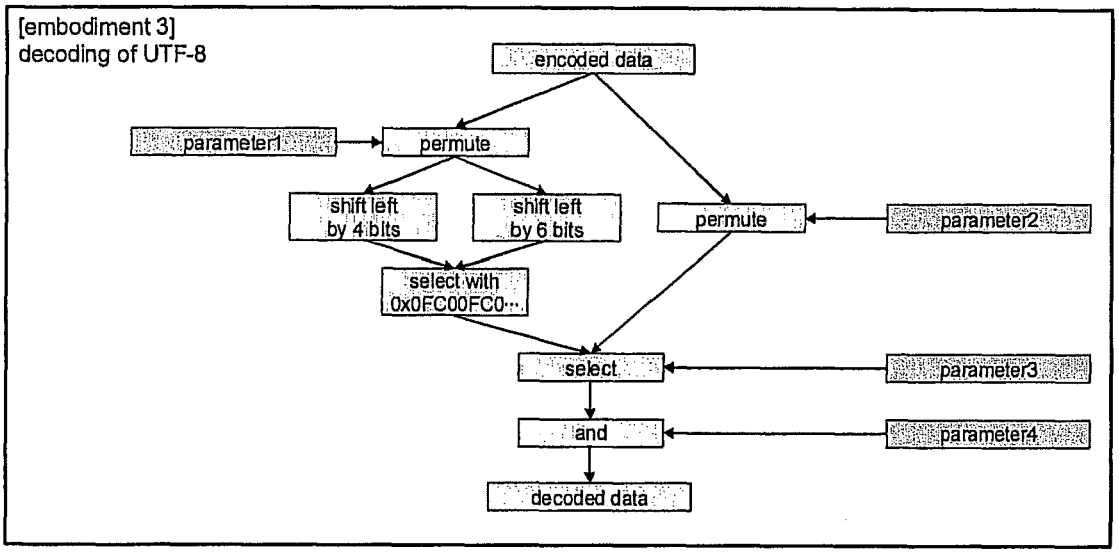
FIG. 7 illustrates one example of obtaining parameters and performing operations of routine 1000 specific to UTF-8 decoding.

Referring to FIG. 7 there is illustrated one example of example of Steps 2 and 3 of UTF-8 decoding. In an exemplary embodiment, referred to as embodiment 3 in FIG. 7, a more complicated example is shown that decodes text of the UTF-8 encoded UNICODE (UCS-2). In the decoding of UTF-8, data transfer has to be conducted by bit as well. In UTF-8, when expressing the character code of UCS-2, it is encoded into any one of three kinds of encoding; one byte (ASCII character, 0x00-0x7F), two bytes (Latin character, etc., 0x80-0x7FF), or three bytes (Japanese, etc., 0x800-0xFFFF). As an example, when it is encoded into three-byte length data, three-byte UTF-8 data of [1110xxxx], [10yyyyyy], and [10zzzzzz] has to be transformed into two-byte UNICODE characters of [xxxxyyyy] and [yyzzzzzz], which cannot be realized through sorting only in units of bytes.

Even in such a case, although the number of parameters and operations to be performed may increase, routine 1000 of the present invention is applicable. Various alternative methods are conceivable for performing operations; however, as an example, the VMX can perform operations as shown in FIG. 7. An instruction set having more flexible instructions, such as the permute instruction in units of bits can perform more efficient operations.

Figure 8:
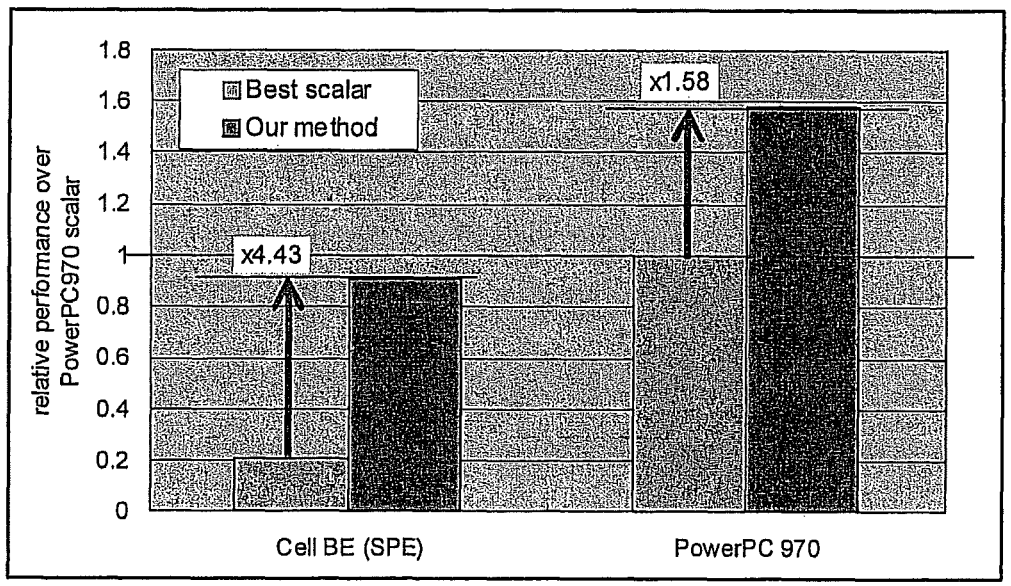
FIG. 8 illustrates one example of the performance of decoding of simple encoding of Table 1.
Figure 9:
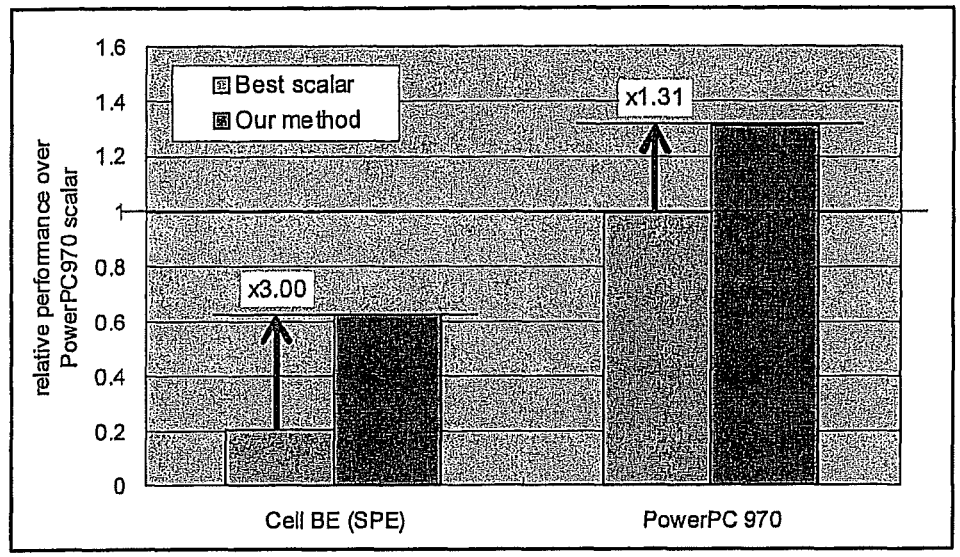
FIG. 9 illustrates one example of the performance of decoding of BER compression.

Routine 1000 of the present invention has been implemented and evaluated. The results of performance evaluations of Embodiments 1 and 2, conducted on the PowerPC970 and the SPE of the Cell BE processor, are illustrated in FIGS. 8 and 9. In either example, great improvements in performance are obtained by using the present invention in each design.

Figure 10:
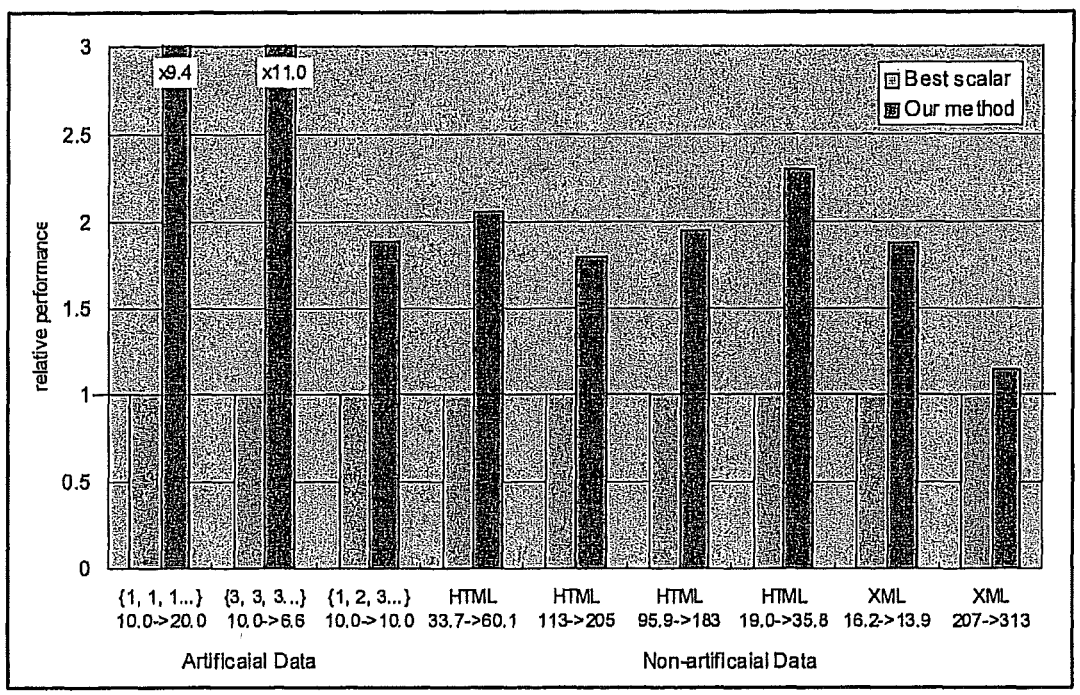
FIG. 10 illustrates one example of the performance of UTF-8 decoding.

The performance of decoding the UTF-8 of embodiment 2, implemented on the PowerPC970, is shown in FIG. 10. The label of the x-axis is the type of document, input size (KB)->output size (KB). The three on the left, among the input data used in the test, are artificial data, and they are input in the form of all 1-byte characters (ASCII text), all 3 byte characters (Japanese text), and repetitions of 1, 2, and 3 bytes. Others are text files in real world (mainly HTML), in which the characters to be encoded into all 1-byte characters and into 2 or 3 bytes are intermingled. The graph shown is the relative performance of the implementation compared to a tuned implementation without the method of the present invention. When using the method of the present invention, higher performance is obtained for all documents.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of processing data elements in a decoding operation of variable length encoded data, said method comprising:
   collecting a plurality of data to be decoded;
   determining an encoded data length for each of said plurality of data;
   obtaining a plurality of parameters based on the determination of said encoded data length of each of said plurality of data, wherein obtaining includes looking up said plurality of parameters and performing operations to obtain said plurality of parameters; and
   performing operations on each of said plurality of data;
   wherein performing operations on each of said plurality of data includes decoding using simple format decoding.

2. The method in accordance with claim 1, further comprising:
   permuting said plurality of data.

3. The method in accordance with claim 2, further comprising:
   rearranging each of said plurality of bytes by permutation.

4. A method of processing data elements in a decoding operation of variable length encoded data, said method comprising:
   collecting a plurality of data to be decoded;
   determining an encoded data length for each of said plurality of data;
   obtaining a plurality of parameters based on the determination of said encoded data length of each of said plurality of data, wherein obtaining includes looking up said plurality of parameters and performing operations to obtain said plurality of parameters; and
   performing operations on each of said plurality of data;
   wherein performing operations on each of said plurality of data includes decoding using basic encoding rules.

5. A method of processing data elements in a decoding operation of variable length encoded data, said method comprising:
   collecting a plurality of data to be decoded;
   determining an encoded data length for each of said plurality of data;
   obtaining a plurality of parameters based on the determination of said encoded data length of each of said plurality of data, wherein obtaining includes looking up said plurality of parameters and performing operations to obtain said plurality of parameters; and
   performing operations on each of said plurality of data;
   wherein performing operations on each of said plurality of data includes decoding using UTF-8 rules.

6. A method of simultaneous processing data elements in decoding operation of variable length encoded data, said method comprising:
   collecting a plurality of data to be decoded;
   determining an encoded data length for each of said plurality of data;
   obtaining a plurality of parameters based on the determination of said encoded data length of each of said plurality of data, wherein obtaining includes accessing a table to lookup said plurality of parameters and performing operations to obtain said plurality of parameters;

permuting said plurality of data;

rearranging each of said plurality of bytes by permutation; and decoding said plurality of data by a plurality of rules;

wherein said plurality of rules includes simple format rules.

7. A method of simultaneous processing data elements in decoding operation of variable length encoded data, said method comprising:

collecting a plurality of data to be decoded;

determining an encoded data length for each of said plurality of data;

obtaining a plurality of parameters based on the determination of said encoded data length of each of said plurality of data, wherein obtaining includes accessing a table to lookup said plurality of parameters and performing operations to obtain said plurality of parameters;

permuting said plurality of data;

rearranging each of said plurality of bytes by permutation; and decoding said plurality of data by a plurality of rules;

wherein said plurality of rules includes basic encoding rules.

8. A method of simultaneous processing data elements in decoding operation of variable length encoded data, said method comprising:

collecting a plurality of data to be decoded;

determining an encoded data length for each of said plurality of data;

obtaining a plurality of parameters based on the determination of said encoded data length of each of said plurality of data, wherein obtaining includes accessing a table to lookup said plurality of parameters and performing operations to obtain said plurality of parameters;

permuting said plurality of data;

rearranging each of said plurality of bytes by permutation; and decoding said plurality of data by a plurality of rules;

wherein said plurality of rules includes decoding of UTF-8.

* * * * *